Feb. 9, 1971 R. D. LARRABEE 3,562,665

MICROWAVE OSCILLATOR INCLUDING TWO BULK NEGATIVE RESISTANCE DEVICES IN A THREE-TERMINAL CAVITY

Filed May 20, 1969

2 Sheets-Sheet 1

INVENTOR
Robert Dean Larrabee

BY George J. Seligsohn
ATTORNEY

INVENTOR
Robert Dean Larrabee
BY George J. Seligsohn
ATTORNEY

United States Patent Office 3,562,665
Patented Feb. 9, 1971

3,562,665

MICROWAVE OSCILLATOR INCLUDING TWO BULK NEGATIVE RESISTANCE DEVICES IN A THREE-TERMINAL CAVITY

Robert Dean Larrabee, Princeton, N.J., assignor to RCA Corporation, a corporation of Delaware Filed May 20, 1969, Ser. No. 826,163
Int. Cl. H03b 7/14
U.S. Cl. 331—96 8 Claims

ABSTRACT OF THE DISCLOSURE

By employing a microwave resonant cavity structure composed of two mirror-image portions with respect to a plane of symmetry and conductive means situated in the plane of symmetry, where the conductive means has at least one aperture therein for coupling RF energy between the two portions, dissimilar bulk semiconductor negative differential resistance devices may be connected in series with each other without affecting the behavior of the cavity at the RF frequency.

This invention relates to bulk semiconductor negative differential resistance device oscillators and, more particularly, to such oscillators employing a plurality of series-connected bulk semiconductor negative differential resistance devices.

The use of bulk semiconductor negative differential resistance devices, such as doped GaAs, sometimes known as Gunn devices, in microwave oscillators is known. Such devices are capable of operating in several modes including the transit-time or Gunn-effect mode, the quenched mode, the inhibited mode, the hybrid mode and the limited space charge accumulation (LSA) mode. The latter four modes require that the device be located in a microwave resonant cavity which determines the frequency of the microwave oscillator. Although the transit-time mode does not require a cavity to operate, it may be operated in a cavity. Further, as is known, in the transit-time mode oscillations are initiated by a domain which is inherently formed at one terminal of the device when the device is biased beyond a threshold voltage at which the negative differential resistance characteristic of the device begins. In order to initiate the quenched or inhibited mode, in both of which mature domains are formed, a quenching signal at the cavity frequency is required. However, usually such a quenching signal inherently builds up very quickly so that effectively in most cases these modes are also self-starting. However, in the case of the hybrid and LSA modes, where no mature domains are formed, and in certain cases of the quenched or inhibited mode, it is difficult to initiate oscillations, since a signal of relatively high amplitude at the frequency of the cavity must already be present in the cavity in order to start the device oscillating. This signal in some cases can be provided by amplification of noise by the device itself. Even better it may be provided in the cavity by starting means other than the device itself. The hybrid mode and even more so the LSA mode hold the promise of providing higher microwave power than is otherwise obtainable at frequencies of 20 gigahertz and above.

These type of devices follow the so-called frequency square law, which states that for any given output impedance the volume, and hence the power input and output, obtainable from a single device varies inversely as the square of the frequency. Furthermore, at the value of output impedance required to efficiently obtain output power, the power obtainable from a device operating at high microwave frequencies, such as twenty gigahertz or more, is severely limited. Parallel operation of a plurality of these devices is undesirable because it requires the resultant output impedance to be reduced below its optimum value. However, if it could be practically accomplished, series operation of a plurality of devices to obtain high power at high microwave frequencies would work very well. More particularly, two devices in series, for instance, would have twice the length of a single device and, other things being equal, would have twice the impedance of a single device. However, by doubling the cross-section of the two series-connected devices, the resultant impedance of the two devices in series can be made identical to the optimum value of a single device. However, the volume, and hence the power input and hence power output obtainable are increased by a factor of four.

A problem is encountered, however, in connecting a plurality of bulk semiconductor negative differential resistance devices in series with a microwave resonant cavity when a single bias conduction current is passed through both of them for the purpose of causing each of them to oscillate at the cavity frequency. The problem is that the value of threshold current at which the negative differential resistance region begins for each of the two devices must be either identical or, at the very most, differ from each other by a small amount, such as 5–10 percent, which depends upon the RF displacement current which flows through the devices when they operate or upon their breakdown characteristics. In any case, it is difficult, especially in the hybrid or LSA mode, to obtain a plurality of bulk semiconductor negative differential resistance devices whose value of threshold current match each other within this required tolerance.

One way of overcoming this problem is to provide two series-connected devices with a third terminal connected to the interface between the two devices, in addition to the normally provided terminals connected respectively to the distal ends of the two devices, and connect all three terminals to the exterior of the microwave resonant cavity in which the devices are located. If this could be done, either one or both of the devices could be shunted by an appropriate external impedance connected between the third terminal and either one or both distal terminals. This would make it possible to independently control the value of bias current through each of the series-connected devices. However, in a conventional microwave resonant cavity structure, the presence of conductive means passing through the cavity for connecting an external impedance to the third terminal at the junction of the two series-connected devices within the cavity causes perturbations in the cavity's radio frequency response which cannot be tolerated.

The present invention is addressed to a solution of this problem which makes a three-terminal microwave oscillator of the type described above, with its attendant advantages, practicable. In particular, the present invention is directed to a microwave oscillator comprising a cavity structure capable of supporting a microwave frequency in which are located at least first and second bulk semiconductor negative differential resistance devices each capable of generating energy at the given frequency, in which conductive means is provided which is coupled to the first and second devices and which is oriented so that it is capable of carrying a separate bias current from the exterior of the cavity structure to and through each of the first and second devices without affecting the behavior of the cavity structure at the given frequency. The conductive means includes at least one aperture for permitting coupling throughout the cavity structure of energy at the given frequency generated by the first device and generated by the second device.

In accordance with a preferred embodiment of the present invention, the cavity structure comprises first and second conductive cavity portions which are substantially mirror images of each other and which are respectively situated on opposite sides of and spaced from a given plane in mirror image symmetrical relationship with respect to the plane. The cavity structure also includes a third conductive plane portion having at least one aperture therein situated in the given plane between the first and second portions and in spaced relationship with respect thereto. The third portion extends at least to the periphery of the cavity structure. This results in the first, second and third portions all being mutually insulated from each other. However, the first and second portions are capacitively coupled to each other by a reactance which is negligible at the given frequency of the cavity structure and the aperture in the third portion permits coupling of energy at the given frequency between the first and second portions. The first device is located wholly within the first cavity portion and is conductively connected between the first and third portions and the second device is located wholly within the second cavity portion and is conductively connected between the second and third portions.

It is therefore an object of the present invention to provide an improved microwave oscillator employing a plurality of series-connected bulk semiconductor negative differential resistance devices.

This and other objects, features and advantages of the present invention will become more apparent from the following detailed description taken together with the accompanying drawing, in which.

Figure 1:
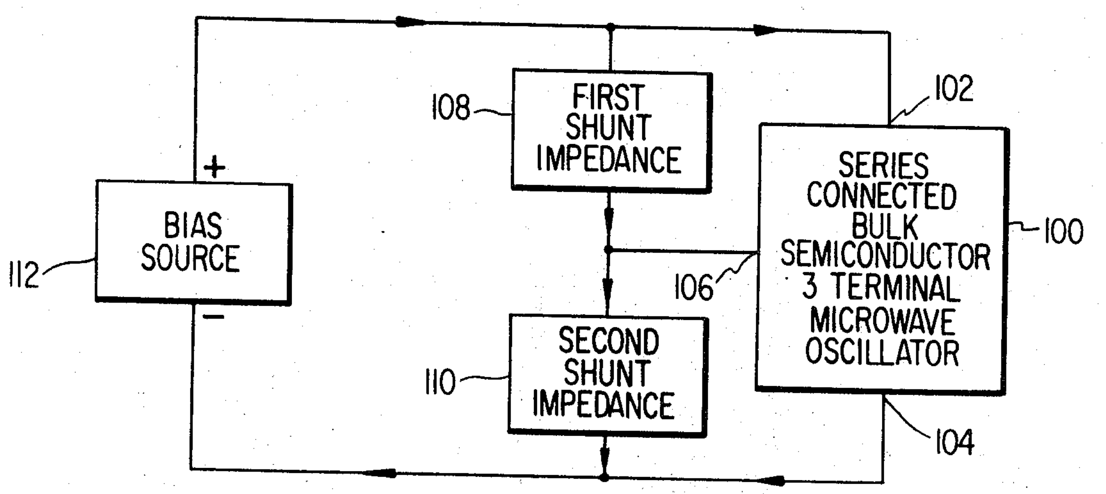
FIG. 1 is a block diagram of an embodiment of the present invention.
Figure 2:
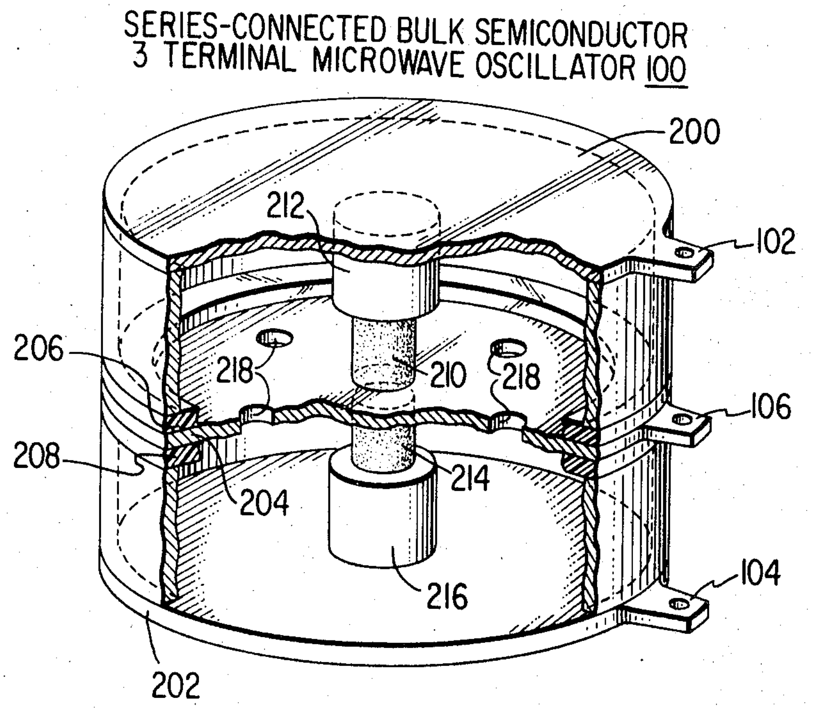
FIG. 2 is a perspective showing of the series-connected bulk semiconductor three-terminal microwave oscillator of FIG. 1, with a portion thereof broken away for purposes of clarity.

Referring to FIG. 1, there is shown in block form series-connected bulk semiconductor three terminal microwave oscillator 100, which is shown in detail in FIG. 2. Oscillator 100 is provided with first terminal 102, connected to the distal end of a first of two series-connected bulk semiconductors of oscillator 100, second terminal 104, connected to a second of the two series-connected bulk semiconductors of oscillator 100, and third terminal 106, connected to the junction between the first and second series-connected bulk semiconductors of oscillator 100.

First shunt impedance 108 may be connected between first terminal 102 and third terminal 106 and/or second shunt impedance 110 may be connected between second terminal 104 and third terminal 106.

A bias current is applied through the series-connected bulk semiconductors of oscillator 100 by means of bias source 112, which provides either a continuous DC voltage or a pulsed DC voltage, as the case may be. (In the case where bias source 112 provides a pulsed DC voltage, the duration of each pulse is sufficiently long, relative to the duration of an oscillation period at the microwave frequency generated by oscillator 100, that its pulse characteristics can be neglected as far as this invention is concerned and only its DC level considered.)

FIG. 2 shows the preferred embodiment of oscillator 100. In particular, oscillator 100 comprises a cavity structure including first conductive cavity portion 200, having the pill box cover shape shown, and second conductive cavity portion 202, which is substantially a mirror image of the portion 200. Cavity portions 200 and 202 are respectively situated on opposite sides of and spaced from a given plane in mirror image symmetrical relationship with respect to this plane, as shown. Further, third conductive plane portion 204 is situated in this given plane between first and second cavity portions 200 and 202, respectively. Third conductive plane portion 204 is insulated from first cavity portion 200 by thin insulating ring 206 composed of an insulating material. A similar insulating ring 208 insulates second conductive cavity portion 202 from third conductive plane portion 204.

Terminals 102, 104 and 106, referred to above in the discussion of FIG. 1, are connected, as shown directly to first conductive cavity portion 200, second conductive cavity portion 202 and third conductive plane portion 204, respectively. Centrally located wholly within first cavity portion 200, with one of its ends connected directly to one side of third conductive plane portion 204, is first bulk semiconductor negative differential resistance device 210. The other end of device 210 is conductively connected to first conductive cavity portion 200 by post 212. In a similar manner, second bulk semiconductor negative differential resistance device 214 has its opposite ends conductively connected between the other side of third conductive plane portion 204 and second conductive cavity portion 202 by post 216, as shown. Third conductive plane portion 204 is provided with at least one aperture therethrough, such as apertures 218. These apertures provide coupling between the first and second cavity portions of the cavity structure for microwave RF energy generated by device 210 and/or device 214 when a proper bias current flows in either or both of these devices, as more fully described below.

It will be seen that third conductive plane portion 204 provides means for electrically connecting the junction of devices 210 and 214 to third terminal 106 located on the exterior of the cavity structure of oscillator 100. More significant, however, as far as this invention is concerned is the fact that the geometric position of third conductive plane portion 204 in the mirror-image symmetry plane between substantially mirror-image shaped cavity portions 200 and 202, respectively, results in negligible perturbations in the response of the cavity structure for signals generated by either devices 210 or 214 at the cavity resonant frequency. The reason for this is that because of the geometry of the cavity structure the electric field vector at any pair of corresponding points on the upper and lower surfaces, respectively, of third conductive plane portion 204 will always be perpendicular to the plane of third portion 204, will always point in the same direction, and will always be of substantially the same magnitude. Therefore, the presence of third conductive plane portion 206 in the cavity structure does not have any affect on the electric field pattern of the microwave oscillations within the cavity. Thus, the same electric field pattern exists within the cavity structure in the presence of third conductive plane portion 204 as would exist in the absence thereof. However, since conductive plane portion 204 acts as a shield, it is necessary to provide one or more apertures 218 therein to permit coupling of electro-magnetic energy between the upper and lower cavity portion.

As discussed above, the main purpose for providing a third terminal at the junction of the two series-connected bulk semiconductor devices is so that the conductive biasing current applied to each of them may be independently and optimally controlled by the use of one or more shunt impedances, as shown in FIG. 1. Depending upon the desired operation of oscillator 100, these shunt impedances may take different forms.

Figure 3:
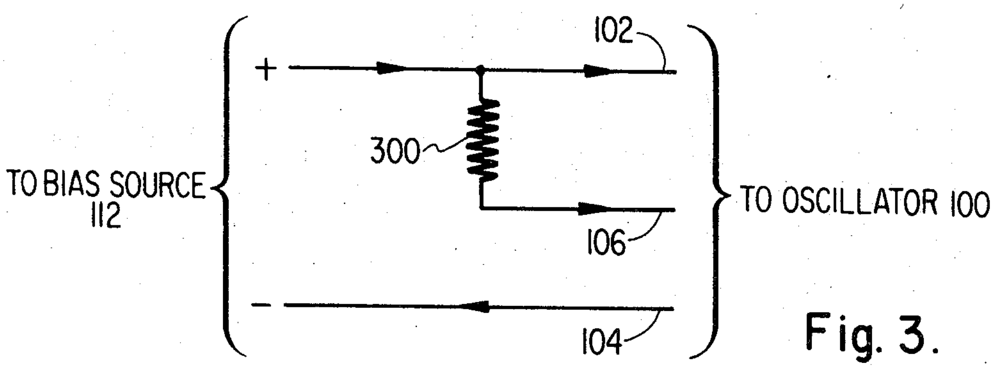
FIG. 3 is a first embodiment of the first and second shunt impedances shown in FIG. 1.

In the case where the two series-connected bulk semiconductor negative differential resistance devices differ in their threshold currents by an amount sufficiently great that there is no single conduction bias current through both of these devices which will permit both of the devices to generate oscillations at the cavity frequency, a device having the smaller threshold current (which in FIG. 3 is assumed to be device 210 in FIG. 2) is merely shunted by resistance 300, shown in FIG. 3, connected between first terminal 102 and third terminal 106. The value of resistance 300 is chosen so that the appropriate value of threshold current will flow in each respective device to cause that device to generate oscillations. In the case of FIG. 3, no second shunt impedance is required between second terminal 104 and third terminal 106.

There are situations in which one of the two series-connected devices is to be operated only temporarily for the purpose of starting the other of the two series-connected devices. Such operation may be desirable when the device to be started is capable of operating in either its hybrid or LSA mode at the cavity frequency, both of which are not self-initiating modes (or sometimes in its quenched or inhibited mode), while the starter device is usually operated in the self-initiating transit-time mode. This can be accomplished by providing the starter device with a higher value of threshold current than that of the deviec to be started, and then providing impedance means for temporarily applying the extra required bias current through the starter device.

Figure 4:
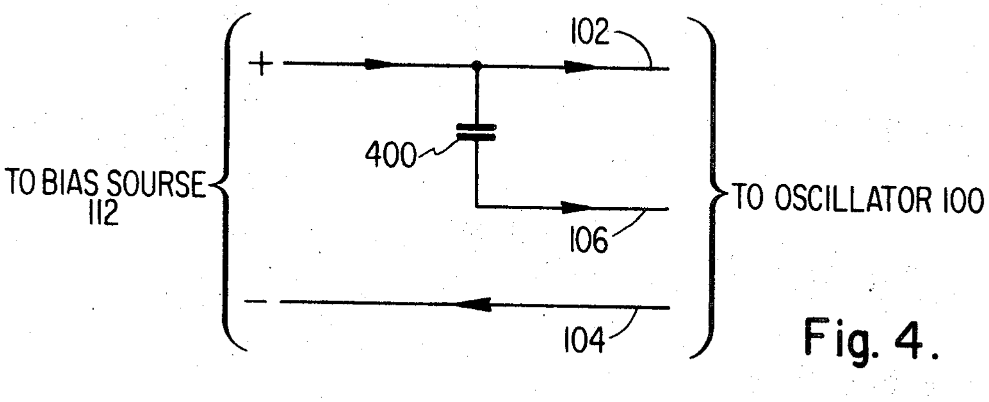
FIG. 4 is a second embodiment of the first and second shunt impedances shown in FIG. 1.

One simple manner in which this may be accomplished, shown in FIG. 4, utilizing the three terminal microwave oscillator of the present invention is to utilize a capacitance 400 of the proper value as the first shunt impedance connected between first terminal 102 and third terminal 106 of oscillator 100. In this case, device 214 is assumed to be the starter device operated in a self-initiating mode and device 210 is assumed to be the device to be started operating in a non-self-initiating mode. Only during a time interval, determined both by the difference in value of threshold currents of the two devices and the time constant of the charging circuit for capacitance 400 of FIG. 4, will the starter device be operated to effect the starting of the device to be started. The second shunt impedance shown in FIG. 1 is not required in FIG. 4.

Figure 5:
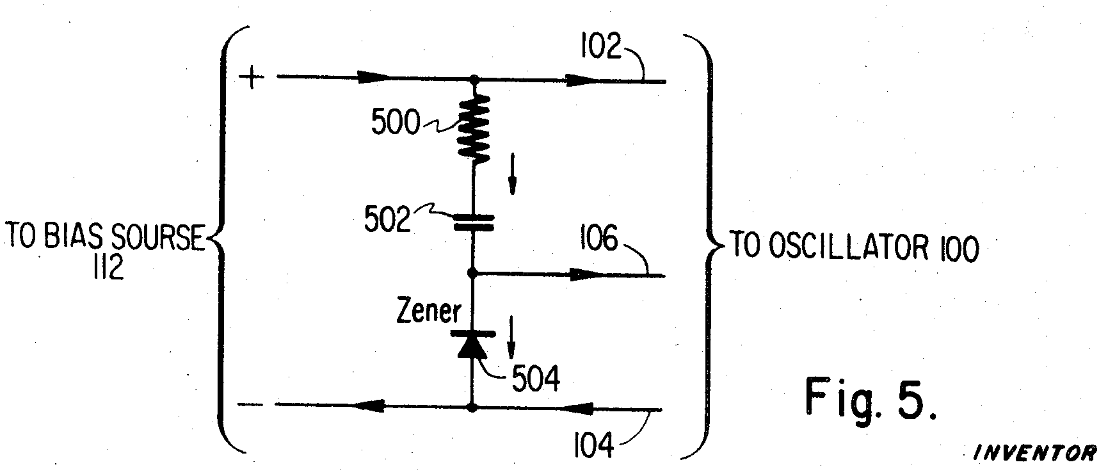
FIG. 5 is a third embodiment of the first and second shunt impedances shown in FIG. 1.

FIG. 5 shows a more sophisticated circuit for accomplishing the same purpose as that of FIG. 4. In particular, in FIG. 5 the device to be started is shunted by a first impedance including series-connected resistance 500 and capacitance 502. The starting device is shunted by a second impedance composed of Zener diode 504. The presence of resistance 500 controls the time constant for charging capacitance 502, and hence the time interval in which the starter device remains operating, with higher resolution than the circuitry of FIG. 4, while after the device to be started has in fact started, Zener diode 504 controls the applied voltage with high resolution.

The specific types of impedances shown in FIGS. 3, 4 and 5 are merely meant to be illustrative of the form that first shunt impedance 108 and/or second shunt impedance 110 of FIG. 1 may take. It is the fact that a three-terminal microwave oscillator of the type described above offers great versatility in coupling external networks to the oscillator which is considered to be more important than the particular form any given network takes.

Although only two series-connected devices are utilized in the described preferred embodiment, the invention also envisages the use of more than two such devices connected in series. In this case, the cavity structure will include a corresponding greater number of cavity portions. However, any two contiguous cavity portions of the cavity structure would still be substantially mirror images of each other and would still be oriented in mirror image symmetrical relationship with respect to a plane in which is located a conductive plane portion of the cavity structure, the latter having at least one aperture therein.

What is claimed is:

1. In a microwave oscillator comprising a cavity structure capable of suporting a given microwave frequency in which are located first and second bulk semiconductor negative differential resistance devices each capable of generating energy at said given frequency; the improvement comprising conductive means coupled to said first and second devices which is oriented so that it is capable of carrying a separate bias current from the exterior of said cavity structure to and through each of said first and second devices without affecting the behavior of said cavity structure at said given frequency, said conductive means including at least one aperture therein for permitting coupling throughout said cavity structure of energy at said given frequency generated by said first device and generated by said second device.

2. In a microwave oscillator comprising a cavity structure capable of supporting a given microwave frequency in which are located first and second bulk semiconductor negative differential resistance devices each capable of generating energy at said given frequency; the improvement wherein said cavity structure comprises first and second conductive cavity portions which are substantially mirror images of each other and which are respectively situated on opposite sides of and spaced from a given plane in mirror image symmetrical relationship with respect to said plane, a third conductive plane portion having at least one aperture therein situated in said given plane between said first and second portions and in spaced relationship with respect thereto, said third portion extending to the periphery of said cavity structure, whereby said first, second and third portions are all mutually insulated from each other, said first and second portions being capacitively coupled to each other with a reactance which is negligible at said given frequency and said aperture in said third portion permitting coupling of energy at said given frequency between said first and second portions, and wherein said first device is located wholly within said first cavity portion and is conductively connected between said first and third portions and said second device is located wholly within said second cavity portion and is conductively connected between said second and third portions, whereby separate biasing currents may be applied to and through said first and second devices respectively without affecting the behavior of said cavity structure at said given frequency and said first and second devices are effectively coupled to each other at said given frequency.

3. The oscillator defined in claim 2, wherein the threshold current of said first device is lower than that of said second device by an amount such that there is no single given value of current which can be simultaneously applied through each of said first device and said second device which will cause both of said devices to generate oscillations.

4. The oscillator defined in claim 3, including impedance means external to said cavity structure coupled between said first portion and said third portion which is capable of carrying current substantially equal to the difference between said second and first values of threshold current.

5. The oscillator defined in claim 4, wherein said impedance comprises a resistance.

6. The oscillator defined in claim 4, wherein said impedance comprises a capacitance, whereby said second device is capable of generating oscillations only during the charging of said capacitance.

7. The oscillator defined in claim 6, further including a voltage regulating element external to said cavity structure, coupled between said second portion and said third portion.

8. The oscillator defined in claim 2, including insulating means coupling the periphery of said first portion to the periphery of said third portion and the periphery of said second portion to the periphery of said third portion to thereby provide said capacitive coupling.

References Cited

UNITED STATES PATENTS

| | | | |
|---|---|---|---|
| 3,479,611 | 11/1969 | Sandbank et al. | 331—107(G)X |
| 3,491,310 | 1/1970 | Hines | 331—96 |

ROY LAKE, Primary Examiner

S. H. GRIMM, Assistant Examiner

U.S. Cl. X.R.

331—107; 333—83